(12) United States Patent
Harb et al.

(10) Patent No.: US 8,129,867 B2
(45) Date of Patent: Mar. 6, 2012

(54) RF AC/DC COUPLING CIRCUIT USING GENERAL PURPOSE SOLID-STATE RELAY

(75) Inventors: Zaher G. Harb, Round Rock, TX (US); Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 351 days.

(21) Appl. No.: 12/410,127

(22) Filed: Mar. 24, 2009

(65) Prior Publication Data

US 2009/0322157 A1      Dec. 31, 2009

Related U.S. Application Data

(60) Provisional application No. 61/076,382, filed on Jun. 27, 2008.

(51) Int. Cl.
    *H01H 47/00*    (2006.01)
(52) U.S. Cl. ...................................................... 307/128
(58) Field of Classification Search .................. 307/125, 307/128; 333/175, 132, 24 R, 180, 181, 333/192, 198, 24 C, 230
See application file for complete search history.

(56) References Cited

U.S. PATENT DOCUMENTS

| | | | |
|---|---|---|---|
| 3,602,741 A * | 8/1971 | Ressler et al. | 327/333 |
| 3,611,198 A * | 10/1971 | Ma | 333/132 |
| 4,551,636 A | 11/1985 | Andrews et al. | |
| 4,829,567 A * | 5/1989 | Moisin | 379/413 |
| 5,101,179 A * | 3/1992 | Jarrett et al. | 333/1 |
| 6,411,161 B1 | 6/2002 | Yamamoto | |
| 6,836,107 B2 | 12/2004 | Mende | |
| 6,945,786 B2 * | 9/2005 | Ammar et al. | 439/65 |
| 7,280,032 B2 * | 10/2007 | Aekins et al. | 340/12.32 |
| 7,554,827 B2 | 6/2009 | Wang | |
| 7,719,380 B2 | 5/2010 | Yetter et al. | |

* cited by examiner

*Primary Examiner* — Albert W Paladini
(74) *Attorney, Agent, or Firm* — Meyertons Hood Kivlin Kowert & Goetzel, P.C.; Jeffrey C. Hood

(57) ABSTRACT

A system and method for overcoming the parasitic elements associated with off the shelf or general purpose solid-state devices configured to operate as RF AC/DC signal coupling networks. An AC/DC signal coupling network may comprise a general purpose solid-state relay device and two inductors having values carefully chosen to compensate for the imperfections and intrinsic parasitic elements associated with the solid-state relay. The inductors may also have values carefully chosen to compensate for the parasitic elements of the neighboring or coupled circuit, and for the capacitance that is associated with the printed circuit board bond pad that is directly dependent upon the area of the pad and distance to the neighboring conductors. The inductors may cause the input path to become inductive as the signal frequency increases, and also improve the input return loss over the RF input range.

19 Claims, 3 Drawing Sheets

RF AC/DC COUPLING CIRCUIT USING GENERAL PURPOSE SOLID-STATE RELAY

PRIORITY CLAIM

This application claims benefit of priority of provisional application Ser. No. 61/076,382 titled "RF AC/DC Coupling Circuit Using General Purpose Solid-State Relay", filed on Jun. 27, 2008, whose inventors are Zaher Harb and Mark Whittington, and which is hereby incorporated by reference as though fully and completely set forth herein.

FIELD OF THE INVENTION

The present invention relates to the field of instrumentation design, and more particularly to a coupling circuit using general purpose solid-state relays.

DESCRIPTION OF THE RELATED ART

In many industrial applications (and others), instruments collect data or information from an environment or unit under test (UUT), and may also analyze and process acquired data. Some instruments provide test stimuli to a UUT. Examples of instruments include oscilloscopes, digital multimeters, pressure sensors, arbitrary waveform generators, digital waveform generators, etc. The information that may be collected by respective instruments includes information describing voltage, resistance, distance, velocity, pressure, oscillation frequency, humidity, and/or temperature, among others. Computer-based instrumentation systems typically include transducers for capturing a physical phenomenon and generating a representative electrical signal, signal conditioning logic to perform amplification on the electrical signal, isolation, and/or filtering, and analog-to-digital (A/D) conversion logic for receiving analog signals and providing corresponding digital signals to the host computer system.

In a computer-based system, the instrumentation hardware or device is typically an expansion board plugged into one of the I/O slots of the computer system. In another common instrumentation system configuration, the instrumentation hardware is coupled to the computer system via other means such as through a VXI (VME extensions for Instrumentation) bus, a GPIB (General Purpose Interface Bus), a PXI (PCI extensions for Instrumentation) bus, Ethernet, a serial port or bus, or parallel port of the computer system. The instrumentation hardware may include a DAQ (Data Acquisition) board, a computer-based instrument such as a multimeter, or another type of instrumentation device. In another common system configuration, boards inserted in a chassis may operate as a standalone instrument or instrument suite, although in some cases a host computer may be used to configure or program the boards prior to, or during operation.

The instrumentation hardware may be configured and controlled by software executing on a host computer system coupled to the system, or by a controller card installed in the chassis. The software for configuring and controlling the instrumentation system typically includes driver software and the instrumentation application software, or the application. The driver software serves to interface the instrumentation hardware to the application and is typically supplied by the manufacturer of the instrumentation hardware or by a third party software vendor. The application is typically developed by the user of the instrumentation system and is tailored to the particular function that the user intends the instrumentation system to perform. The instrumentation hardware manufacturer or third party software vendor sometimes supplies application software for applications that are common, generic, or straightforward. Instrumentation driver software provides a high-level interface to the operations of the instrumentation device. The instrumentation driver software may operate to configure the instrumentation device for communication with the host system and to initialize hardware and software to a known state. The instrumentation driver software may also maintain a soft copy of the state of the instrument and initiated operations. Further, the instrumentation driver software communicates over the bus to move the device from state to state and to respond to device requests.

As previously mentioned, one of the instruments that may be used to provide test stimuli to a UUT is an oscilloscope. The input stage of a common oscilloscope typically incorporates an AC/DC coupling network that can be used to block out the DC component of a signal when only the characteristics of the AC component of the signal are to be measured. In a common oscilloscope, AC/DC coupling can be accomplished by using two switching elements 306 and 310 as shown in the circuit of FIG. 3, or by using one switching element 328 as shown in the circuit of FIG. 4. In both cases, a signal source 302 with a resistive component 304 may be coupled to an input (indicated by a resistive component 314) via switching elements 306/310, and switching element 328, respectively. Switching elements 306, 310, and/or 328 can be either electromechanical or solid-state relays.

When the simple AC/DC coupling circuit shown in FIG. 3 is configured in DC coupled mode, coupling capacitor 308 is bypassed by a straight through path 316. When the AC/DC coupling circuit shown in FIG. 4 is in DC coupled mode, coupling capacitor 324 is short circuited by relay 328, through path 318. When either of the circuits is configured in AC coupled mode, coupling capacitors 308 and 324 respectively form a high pass filter with the resistive component of the input impedance, resistor 314.

In general, solid-state relays are preferred because they have no mechanical parts, making their life expectancy higher than that of an electromechanical relay. They also consume less power, are not sensitive to electromagnetic interference (EMI), have faster switching times, and typically incur a lower cost. However, RF oscilloscopes typically comprise electromechanical relays, since the parasitic elements that are inherent to solid-state relays would degrade the bandwidth, flatness of the frequency response, and input return loss of the oscilloscope. In addition, the intrinsic parasitic elements in solid-state relays interact with the parasitic and complex impedance of the neighboring or following circuitry, creating signal bandwidth and input return loss degradation. Keeping the input return loss optimal across the frequency range is desired to obtain well matched high frequency instrument input impedance and high system bandwidth. Other, more expensive solutions used in lieu of electromechanical relays include low intrinsic parasitic active RF (radio frequency) switches and other complex RF active switching networks.

Other corresponding issues related to the prior art will become apparent to one skilled in the art after comparing such prior art with the present invention as described herein.

SUMMARY OF THE INVENTION

Various embodiments of the invention comprise an RF AC/DC coupling circuit configured with a general purpose solid-state relay and a coupling capacitor. The RF AC/DC coupling circuit may comprise two inductors, each inductor having a carefully chosen value, in order to compensate for the imperfections and intrinsic parasitic elements that may be associated with the general purpose solid-state relay comprised in the coupling circuit. The inductors may also operate to compensate for the parasitic elements of the neighboring or subsequently coupled circuitry, and the capacitance associated with the printed circuit board bond pad that may be directly dependent upon the area of the pad and distance to the neighboring conductors.

In one set of embodiments, the inductors configured in the coupling circuit may operate to develop an inductive input path as the signal frequency increases, and improve the input return loss over the RF (radio frequency) input range. This may occur as the parasitic capacitive admittances (inverse of the parasitic capacitive impedances) looking into the solid-state relay, the coupling capacitor, and the subsequently coupled circuitry are partially cancelled with inductive admittances. By eliminating parasitic elements associated with the general purpose solid-state relay, the need for expensive, higher power, complex, or custom methods for RF AC/DC signal coupling may be obviated.

In one set of embodiments, a system may include a coupling circuit that comprises a source input configured to receive an input signal to be measured, a first inductor having a first inductance value and further having a first terminal coupled to the source input, a second inductor having a second inductance value and further having a first terminal coupled to an input of a measuring device (such as an oscilloscope), a coupling capacitor having a first terminal coupled to a second terminal of the first inductor and further having a second terminal coupled to a second terminal of the second inductor, and a general purpose solid-state relay coupled across the first terminal and the second terminal of the coupling capacitor. The general purpose solid-state relay may be configured to short circuit the first terminal and the second terminal of the first capacitor when operated in DC mode, to enable an input signal applied to the source input to bypass the first capacitor. The general purpose solid-state relay may be further configured to couple the first capacitor into the signal path of the input signal when operated in AC mode.

The first inductance value and the second inductance value may be chosen such that the first inductor and the second inductor operate to develop an inductive input path as the frequency of the input signal increases, to overcome parasitic elements associated with the general purpose solid-state relay. The first inductance value and the second inductance value may further be chosen to partially cancel parasitic capacitive input admittances of the general purpose solid-state relay, the measuring device, and the first capacitor. In one embodiment, the coupling circuit is configured on a printed circuit board using bond pads of the printed circuit board, in which case the first inductance value and the second inductance value may also be chosen to partially compensate for capacitance associated with the bond pads of the printed circuit board that may be directly dependent upon the area of the bond pads and distance to neighboring conductors on the printed circuit board.

Other aspects of the present invention will become apparent with reference to the drawings and detailed description of the drawings that follow.

BRIEF DESCRIPTION OF THE DRAWINGS

A better understanding of the present invention can be obtained when the following detailed description of the preferred embodiment is considered in conjunction with the following drawings, in which.

Figure 1:
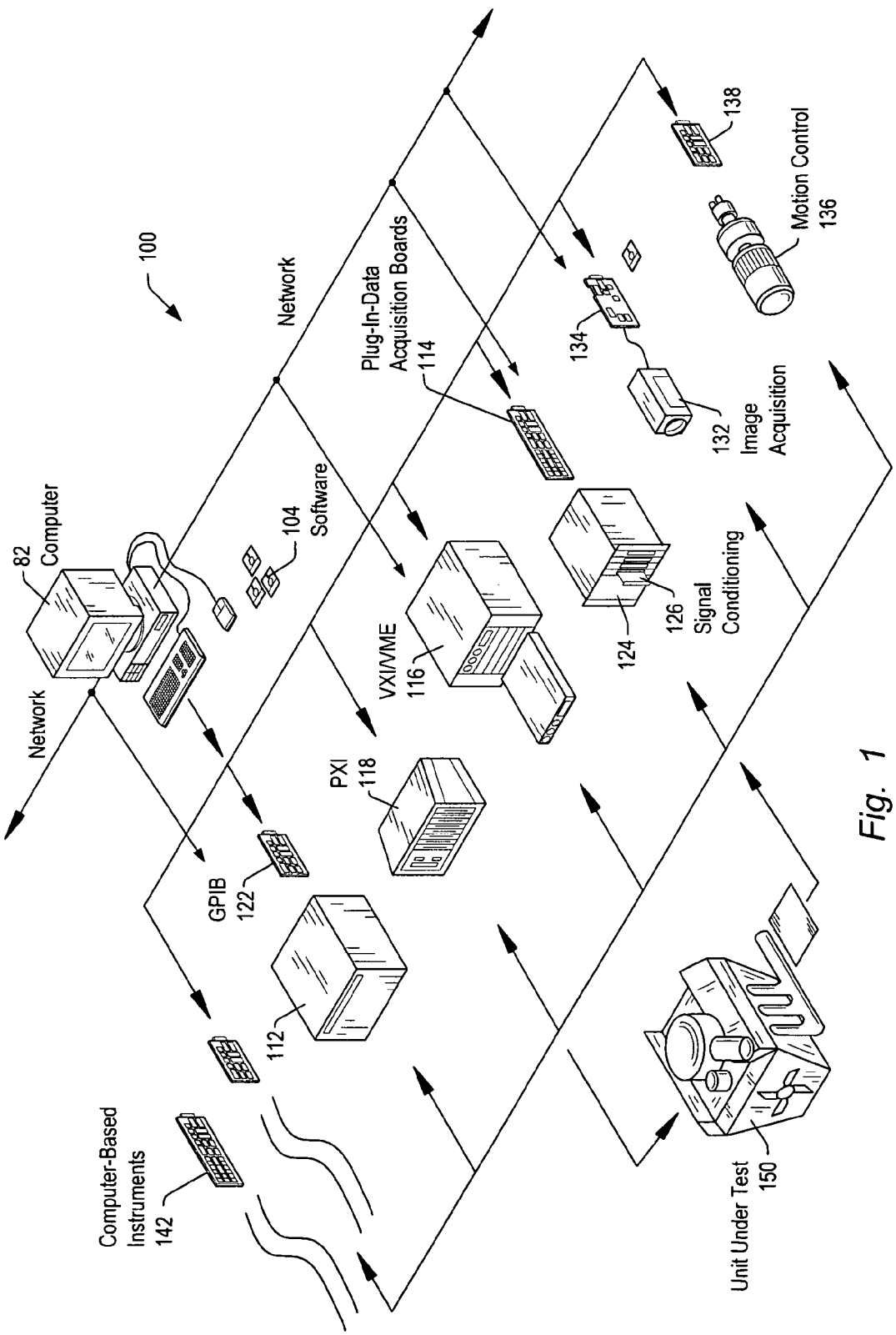
FIG. 1 shows an instrumentation control system with instruments networked together according to one embodiment of the invention.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Embodiments of the present invention may be used in systems configured to perform test and/or measurement functions, to control and/or model instrumentation or industrial automation hardware, or to model and simulate functions, e.g., modeling or simulating a device or product being developed or tested, etc. More specifically, embodiments may be used in various instances where AC/DC coupling may be required, keeping the input return loss optimal across the frequency range to obtain matched high frequency instrument input impedance and high system bandwidth. However, it is noted that embodiments of the present invention may equally be used for a variety of applications, and are not limited to the applications enumerated above. In other words, applications discussed in the present description are exemplary only, and embodiments of the present invention may be used in any of various types of systems. Thus, embodiments of the present invention are operable to be used in any of various types of applications.

FIG. 1 illustrates an exemplary instrumentation control system 100 which may be configured according to embodiments of the present invention. System 100 comprises a host computer 82 which may couple to one or more instruments configured to perform a variety of functions using timing control implemented according to various embodiments of the present invention. Host computer 82 may comprise a CPU, a display screen, memory, and one or more input devices such as a mouse or keyboard as shown. Computer 82 may operate with one or more instruments to analyze, measure, or control a unit under test (UTT) or process 150. The one or more instruments may include a GPIB instrument 112 and associated GPIB interface card 122, a data acquisition board 114 inserted into or otherwise coupled with chassis 124 with associated signal conditioning circuitry 126, a VXI instrument 116, a PXI instrument 118, a video device or camera 132 and associated image acquisition (or machine vision) card 134, a motion control device 136 and associated motion control interface card 138, and/or one or more computer based instrument cards 142, among other types of devices.

The computer system may couple to and operate with one or more of these instruments. In some embodiments, the computer system may be coupled to one or more of these instruments via a network connection, such as an Ethernet connection, for example, which may facilitate running a high-level synchronization protocol between the computer system and the coupled instruments. The instruments may be coupled to the unit under test (UUT) or process 150, or may be coupled to receive field signals, typically generated by transducers. System 100 may be used in a data acquisition and control applications, in a test and measurement application, an image processing or machine vision application, a process control application, a man-machine interface application, a simulation application, or a hardware-in-the-loop validation application, among others.

Figure 2:
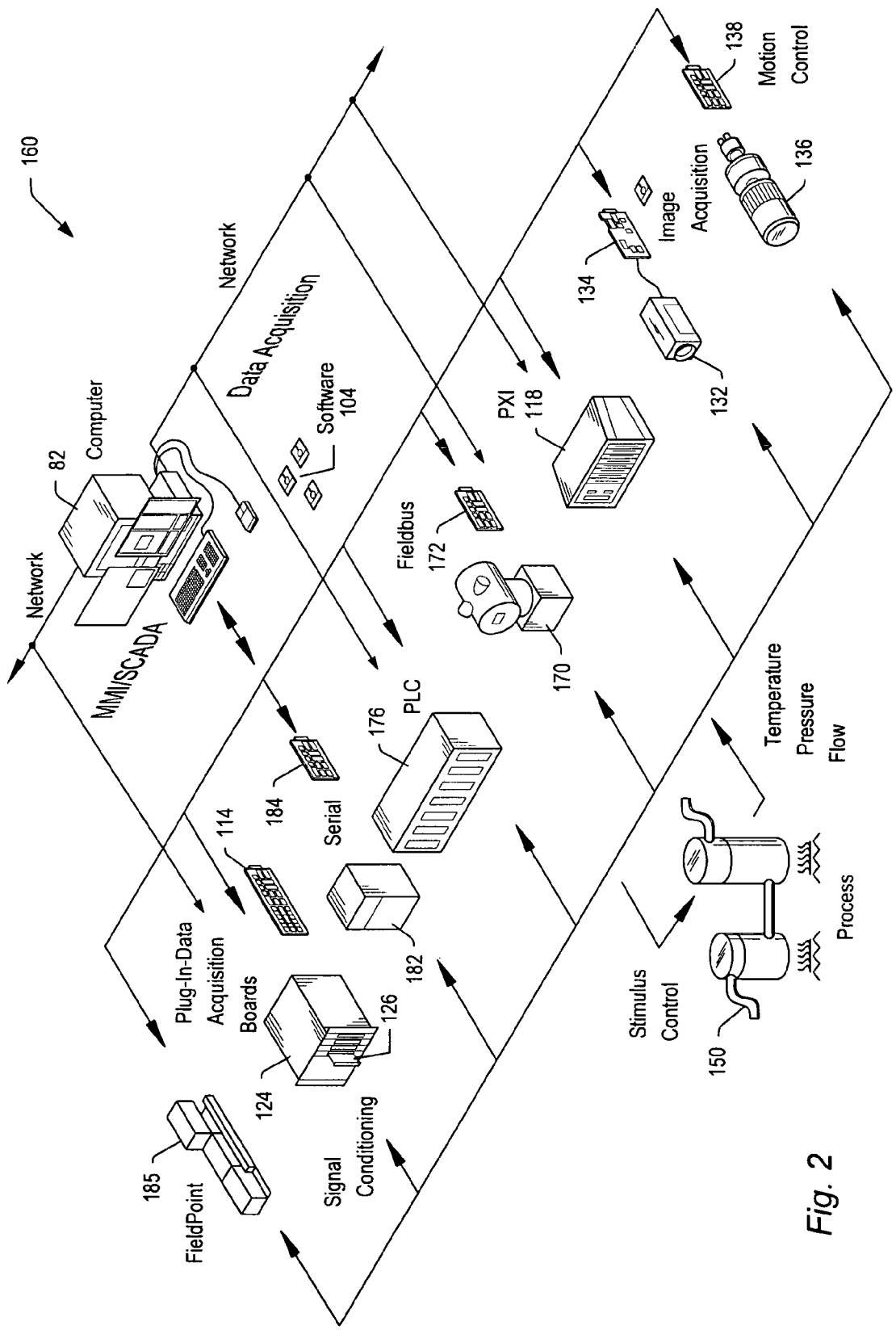
FIG. 2 shows an industrial automation system with instruments networked together according to one embodiment of the invention.
Figure 3:
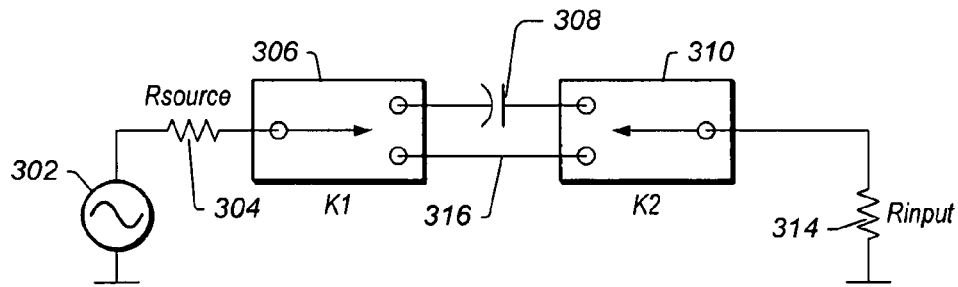
FIG. 3 shows an AC/DC coupling circuit utilizing two switching elements, according to principles of prior art.
Figure 4:
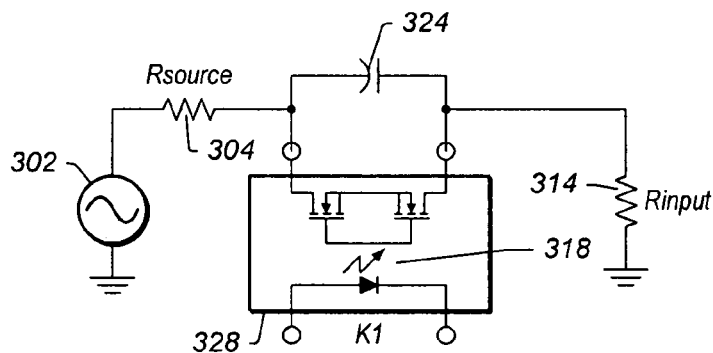
FIG. 4 shows an AC/DC coupling circuit utilizing one switching element, according to principles of prior art.

FIG. 2 illustrates an exemplary industrial automation system 160 that may be configured according to embodiments of the present invention. Industrial automation system 160 may be similar to instrumentation or test and measurement system 100 shown in FIG. 2A. Elements that are similar or identical to elements in FIG. 1 have the same reference numerals for convenience. System 160 may comprise a computer 82 which may couple to one or more devices and/or instruments configured to perform a variety of functions using timing control implemented according to various embodiments of the present invention. Computer 82 may comprise a CPU, a display screen, memory, and one or more input devices such as a mouse or keyboard as shown. Computer 82 may operate with the one or more devices and/or instruments to perform an automation function, such as MMI (Man Machine Interface), SCADA (Supervisory Control and Data Acquisition), portable or distributed data acquisition, process control, and advanced analysis, among others, on process or device 150.

The one or more devices may include a data acquisition board 114 inserted into or otherwise coupled with chassis 124 with associated signal conditioning circuitry 126, a PXI instrument 118, a video device 132 and associated image acquisition card 134, a motion control device 136 and associated motion control interface card 138, a field bus device 170 and associated field bus interface card 172, a PLC (Programmable Logic Controller) 176, a serial instrument 182 and associated serial interface card 184, or a distributed data acquisition system, such as the Compact FieldPoint or CompactRIO systems available from National Instruments, among other types of devices. In some embodiments, similar to the system shown in FIG. 1, the computer system may couple to one or more of the instruments/devices via a network connection, such as an Ethernet connection.

Figure 5:
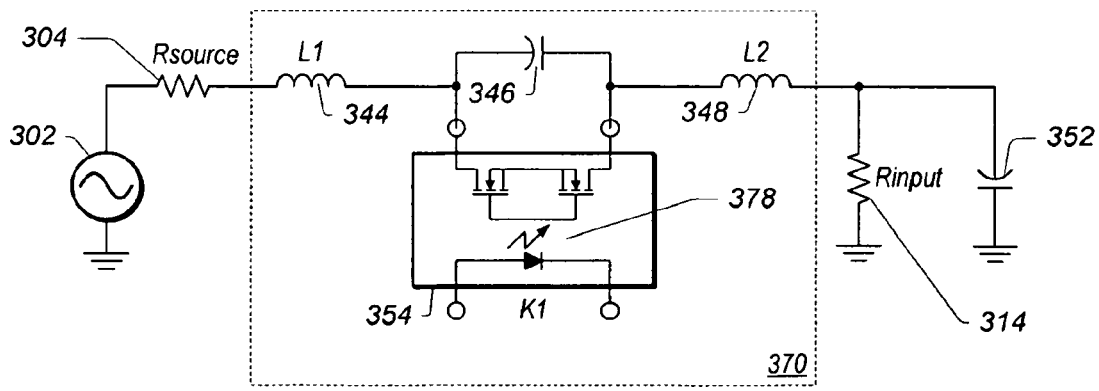
FIG. 5 shows one embodiment of an RF AC/DC coupling circuit using a general purpose solid-state relay and inductors.

FIG. 5 shows an RF AC/DC coupling circuit 370 configured according to one embodiment of the present invention, using a general purpose solid-state relay 354. Coupling circuit 370 may also include a coupling capacitor 346 configured across the terminals of solid-state relay 354 for AC coupled mode. Coupling circuit 370 may be used to couple input signals from an input source to a measuring instrument, such as an oscilloscope, that may be configured in a system such as the one shown in FIG. 1 and/or FIG. 2. As shown in FIG. 5, coupling circuit 370 may be configured to couple input source 302 (having a source resistance 304) to an input represented by input resistance 314.

Circuit 370, shown in FIG. 5 may be configured with two inductors, 344 and 348, each having carefully chosen inductance values to compensate for the imperfections and intrinsic parasitic elements that may be associated with an off the shelf general purpose solid-state relay, such as relay 354, for example. Coupling circuit 370 may be configured to operate in at least two modes, a DC coupled mode and an AC coupled mode. In AC coupled mode, the circuit path includes coupling capacitor 324, which may form a high-pass filter with the resistive component of the input impedance, resistor 314. In DC coupled mode, the signal path does not include coupling capacitor 346, which may be bypassed by solid-state relay 354 via RF coupling path 378.

By carefully selecting specific values for inductors 344 and 348, they may also compensate for the parasitic elements of the neighboring or following circuitry, for example, parasitic capacitance 352, which may be associated with the input circuit and/or neighboring circuits of the input circuit. In other words, the respective values for inductors 344 and 348 may be specified to compensate for any capacitance corresponding to the parasitic capacitance of any one or more circuits coupled to inductor 348. Inductors 344 and 348 may also compensate for the capacitance that may be associated with a printed circuit board bond pad (to which the inductors may be coupled) that may be directly dependent upon the area of the pad and distance to the neighboring conductors.

Inductors 344 and 348 may be configured and operated to develop an inductive input path as the signal frequency increases, and also improve the input return loss over the RF input range. This may occur as the parasitic capacitive admittances (inverse of the parasitic capacitive impedances) looking into solid-state relay 354, coupling capacitor 346, and the following circuitry (represented by input resistance 314 and parasitic capacitance 352) may be partially cancelled with inductive admittances. One benefit of coupling circuit 370 shown in FIG. 5 is that parasitic elements associated with off the shelf or general purpose solid-state devices may be overcome by configuring inductors 344 and 348 as shown, thereby eliminating the need for expensive, higher power, complex, or custom methods for RF AC/DC signal coupling.

Therefore, various embodiments of the present invention may enable extending the bandwidth of circuits in which general purpose solid-state relays are configured to perform an RF AC/DC signal coupling network. Various embodiments may also eliminate the need for expensive, higher power, complex, or custom methods for RF AC/DC signal coupling.

Although the embodiments above have been described in considerable detail, numerous variations and modifications will become apparent to those skilled in the art once the above disclosure is fully appreciated. It is intended that the following claims be interpreted to embrace all such variations and modifications.

We claim:

1. A coupling circuit comprising:
   a solid-state relay having an input terminal and an output terminal;
   a first inductor having a first terminal configured to couple to a source providing an input signal, and a second terminal coupled to the input terminal of the solid-state relay;
   a second inductor having a first terminal coupled to the output terminal of the solid-state relay, and a second terminal configured to couple to an input of a device; and
   a capacitor coupled between the input terminal and the output terminal of the solid-state relay;
   wherein the solid-state relay is configured to couple the input signal to the device through the capacitor when operated in AC coupled mode, and wherein the solid-state relay is configured to couple the input signal to the device bypassing the capacitor when operated in DC coupled mode.

2. The coupling circuit of claim 1, wherein respective values for the first inductor and the second inductor are selected to compensate for imperfections and intrinsic parasitic elements associated with the solid-state relay.

3. The coupling circuit of claim 1, wherein respective values for the first inductor and the second inductor are selected to compensate for parasitic elements associated with the device.

4. The coupling circuit of claim 1, wherein respective values for the first inductor and the second inductor are selected to have the first inductor and the second inductor develop an inductive input path as the signal frequency increases, to improve input return loss over an RF (radio frequency) input range of the device.

5. The coupling circuit of claim 1, wherein respective values for the first inductor and the second inductor are selected to cancel, with inductive admittances, parasitic capacitive admittances looking into the solid-state relay, the capacitor, and the device.

6. The coupling circuit of claim 1, wherein the device is a measuring instrument.

7. The coupling circuit of claim 1, wherein the device comprises the coupling circuit.

8. A system comprising:
    means for receiving an input signal;
    means for providing the input signal to a device through an input path comprising a solid-state relay having an input terminal and an output terminal; and
    means for controlling the input path to make the input path inductive as a frequency of the input signal increases, for partially cancelling, with inductive admittances, parasitic capacitances associated with the input path and the device, to improve return loss of the input signal over a radio frequency (RF) range of the input signal.

9. The system of claim 8, wherein said means for controlling the input path comprises:
    a first inductor having a first terminal configured to receive the input signal, and a second terminal coupled to the input terminal of the solid-state relay; and
    a second inductor having a first terminal coupled to the output terminal of the solid-state relay, and a second terminal configured to couple to an input of the device.

10. The system of claim 9, wherein said means for controlling the input path further comprises:
    a capacitor coupled between the input terminal and the output terminal of the solid-state relay;
    wherein the solid-state relay is configured to couple the input signal to the device through the capacitor when operated in AC coupled mode, and wherein the solid-state relay is configured to couple the input signal to the device bypassing the capacitor when operated in DC coupled mode.

11. The system of claim 8, wherein the device is an oscilloscope.

12. A system comprising:
    a source input configured to receive an input signal to be measured;
    a first inductor having a first inductance value, and further having a first terminal coupled to the source input;
    a second inductor having a second inductance value, and further having a first terminal coupled to an input of a measuring device;
    a first capacitor having a first terminal coupled to a second terminal of the first inductor, and further having a second terminal coupled to a second terminal of the second inductor; and
    a general purpose solid-state relay coupled across the first terminal and the second terminal of the first capacitor;
    wherein the general purpose solid-state relay is configured to short circuit the first terminal and the second terminal of the first capacitor when operated in DC mode, to enable an input signal applied to the source input to bypass the first capacitor.

13. The system of claim 12, wherein the first inductance value and the second inductance value are chosen to develop an inductive input path as a frequency of the input signal increases, to overcome parasitic elements associated with the general purpose solid-state relay.

14. The system of claim 12, wherein the first inductance value and the second inductance value are chosen to partially cancel parasitic capacitive input admittances of one or more of:
    the general purpose solid-state relay;
    the measuring device; and
    the first capacitor.

15. The system of claim 12, wherein the source input, the first inductor, the second inductor, the first capacitor, and the general purpose solid-state relay are configured on a printed circuit board using bond pads of the printed circuit board.

16. The system of claim 15, wherein the first inductance value and the second inductance value are chosen to partially compensate for capacitance associated with the bond pads of the printed circuit board that may be directly dependent upon the area of the bond pads and distance to neighboring conductors on the printed circuit board.

17. The system of claim 12, wherein the measuring device comprises the source input, the first inductor, the second inductor, the first capacitor, and the general purpose solid-state relay.

18. The system of claim 12, wherein the measuring device is an oscilloscope.

19. The system of claim 12, general purpose solid-state relay is configured to couple the first capacitor into the signal path of the input signal when operated in AC mode.

* * * * *